United States Patent

Gabl

(10) Patent No.: US 9,070,879 B2
(45) Date of Patent: Jun. 30, 2015

(54) METHOD FOR MONITORING FLEXURAL VIBRATIONS OF A PIEZOACTUATOR

(75) Inventor: Reinhard Gabl, Kufstein (AT)

(73) Assignee: EPCOS AG, Munich (DE)

( * ) Notice: Subject to any disclaimer, the term of this patent is extended or adjusted under 35 U.S.C. 154(b) by 239 days.

(21) Appl. No.: 13/813,341

(22) PCT Filed: Sep. 2, 2011

(86) PCT No.: PCT/EP2011/065238
§ 371 (c)(1),
(2), (4) Date: Apr. 18, 2013

(87) PCT Pub. No.: WO2012/028735
PCT Pub. Date: Mar. 8, 2012

(65) Prior Publication Data
US 2013/0212848 A1    Aug. 22, 2013

(30) Foreign Application Priority Data

Sep. 3, 2010    (DE) .................. 10 2010 036 257

(51) Int. Cl.
| H01L 41/25 | (2013.01) |
| G01H 1/04 | (2006.01) |
| H01L 41/053 | (2006.01) |
| G01R 29/22 | (2006.01) |

(52) U.S. Cl.
CPC .............. *H01L 41/25* (2013.01); *Y10T 29/42* (2015.01); *G01H 1/04* (2013.01); *H01L 41/053* (2013.01); *G01R 29/22* (2013.01)

(58) Field of Classification Search
CPC ............ H01L 41/0472; H01L 41/0475; H01L 41/083; H01L 41/053; G01H 1/04; G01R 29/22; Y10T 29/42

USPC .................. 29/25.35, 593, 594; 333/187; 310/329–331

See application file for complete search history.

(56) References Cited

U.S. PATENT DOCUMENTS

| 5,446,306 | A | * | 8/1995 | Stokes et al. ............... 257/416 |
| 5,929,555 | A | * | 7/1999 | Sugimoto et al. ........... 310/360 |
| 6,246,151 | B1 | | 6/2001 | Nakano |
| 6,336,366 | B1 | | 1/2002 | Thundat et al. |
| 6,487,505 | B1 | | 11/2002 | Mock et al. |
| 6,841,919 | B2 | | 1/2005 | Akahane et al. |
| 6,953,977 | B2 | | 10/2005 | Mlcak et al. |
| 7,119,475 | B2 | | 10/2006 | Matsuzaki et al. |

(Continued)

FOREIGN PATENT DOCUMENTS

| CN | 1463485 A | 12/2003 |
| CN | 1698259 A | 11/2005 |

(Continued)

OTHER PUBLICATIONS

Bowen, C.R., et al., "Impedance Spectroscopy of Piezoelectric Actuators," Scripta Materialia, vol. 42, 2000, pp. 813-818.

(Continued)

*Primary Examiner* — Minh Trinh
(74) *Attorney, Agent, or Firm* — Slater & Matsil, L.L.P.

(57) ABSTRACT

In the method for monitoring flexural vibrations of a piezoactuator, a small-signal spectrum of a piezoactuator, which is provided and mounted for the purpose of exciting longitudinal vibrations, is measured and an excitation of a transverse vibration in the piezoactuator is detected from resonances occurring in the small-signal spectrum.

11 Claims, 2 Drawing Sheets

(56) References Cited

U.S. PATENT DOCUMENTS

| | | | |
|---|---|---|---|
| 7,424,827 | B2 | 9/2008 | Yamada et al. |
| 8,869,363 | B2 * | 10/2014 | Miyake .................. 29/25.35 |
| 2005/0284224 | A1 | 12/2005 | Yamada et al. |
| 2008/0100176 | A1 | 5/2008 | Haskell et al. |
| 2013/0212848 | A1 * | 8/2013 | Gabl .................. 29/25.35 |

FOREIGN PATENT DOCUMENTS

| | | |
|---|---|---|
| CN | 1947271 A | 4/2007 |
| DE | 1115471 B | 10/1961 |
| DE | 10 2004 016 196 A1 | 11/2005 |
| DE | 10 2005 053 331 A1 | 5/2007 |
| DE | 10 2006 011 725 A1 | 9/2007 |
| DE | 10 2009 003 270 A1 | 11/2010 |
| EP | 0 675 365 A2 | 10/1995 |
| WO | WO 99/40408 A1 | 8/1999 |
| WO | 2005104258 A1 | 11/2005 |
| WO | WO 2009/138422 A1 | 11/2009 |

OTHER PUBLICATIONS

Zickgraf, B., et al., "Fatigue Behaviour of Multilayer Piezoelectric Actuators," Proceedings of the 9$^{th}$ IEEE International Symposium on Applications of Ferroelectrics, Aug. 7, 1991, pp. 325-328.

* cited by examiner

METHOD FOR MONITORING FLEXURAL VIBRATIONS OF A PIEZOACTUATOR

This patent application is a national phase filing under section 371 of PCT/EP2011/065238, filed Sep. 2, 2011, which claims the priority of German patent application 10 2010 036 257.3, filed Sep. 3, 2010, each of which is incorporated herein by reference in its entirety.

TECHNICAL FIELD

The present invention relates to a method for monitoring flexural vibrations in a mounted piezoactuator, and/or for mounting piezoactuators, with the aid of which the occurrence of flexural vibrations in the piezoactuator is avoided as far as possible.

BACKGROUND

A piezoelectric actuator, also denoted as piezoactuator, is constructed with the aid of piezoelectric material and serves as mechanical drive for producing a movement by varying a dimension, specifically the length, of the piezoactuator by means of an electric voltage. A piezoactuator is typically constructed as a piezostack in which layers of a piezoelectric material of alternating polarization directions alternate with metal electrodes. The electrodes are connected alternately to one of two outer electrodes in the sequence of their arrangement.

An electric AC voltage applied to the outer electrodes generates a longitudinal vibration in the longitudinal direction of the piezostack, that is to say in the direction in which the layers of the piezostack follow one another. A longitudinal vibration of the piezoactuator is used in a multiplicity of applications, for example for the purpose of fuel injection. To this end, the piezostack is mounted in its longitudinal direction between holders or accommodating components. Usually, one or more resonance frequencies occur at which the excited longitudinal vibration is particularly strong.

Transverse vibrations which likewise occur are, by contrast, undesired because they cause distortions of the piezoactuator that impair the function of the piezoactuator and, in some instances, deleterious cracks in the edge surfaces of the piezostack. The resonant frequencies of the transverse vibrations are generally much lower than the resonant frequencies of the longitudinal vibrations. For example, the resonant frequency of the longitudinal vibration is typically approximately 12 kHz in the case of a 30 mm piezoactuator while, depending on the mounting of the piezoactuator, transverse vibrations can already occur at 2 kHz to 3 kHz and be excited by signals of relatively low frequency.

Ideally, on the basis of the symmetry, usually present, in the structure of a piezoactuator, no transverse vibrations should occur when the piezoactuator is mounted symmetrically in the holders. However, in practice it is not always possible to exclude a low degree of asymmetry in the mounting of the piezoactuator, nor a mechanical distortion resulting therefrom. In addition, an asymmetry can be present inside the piezoactuator because of manufacturing tolerances, and this likewise favors the occurrence of transverse vibrations.

During mounting or assembling, a most symmetrical mounting is ensured by measurements of the geometric alignment of the piezoactuator in the holders. However, it is not thereby possible to offset an asymmetry present in the piezoactuator itself. In addition, this mounting method does not permit any assessment of the actual inclination of the piezoactuator in relation to flexural vibrations. It is likewise impossible in this way to monitor the occurrence of flexural vibrations during operation of the piezoactuator, in particular a lengthy time after first commissioning, which can be desired in the case, for example, of a piezoactuator which is installed in an engine provided for a motor vehicle.

SUMMARY OF THE INVENTION

In one aspect, the present invention specifies a method for monitoring and, if possible, avoiding flexural vibrations in a piezoelectric actuator that can advantageously be used in the mounting or operation of the actuator.

In the method for monitoring flexural vibrations of a piezoactuator, a small-signal spectrum of a piezoactuator provided and mounted in order to excite longitudinal vibrations is measured, and an excitation of a transverse vibration in the piezoactuator is detected from resonances occurring in the small-signal spectrum.

In one application of the method, in order to mount a piezoactuator the latter is mounted between holders in the longitudinal direction in which the longitudinal vibrations can be excited by applying an AC voltage. These holders are elements, for example parts of an apparatus to which the piezoactuator is mechanically connected and to which a movement produced in the operation of the piezoactuator is transmitted.

A small-signal spectrum of the mounted piezoactuator is measured in a frequency range, and an occurrence of a transverse vibration in the piezoactuator is detected from resonances detectable in the small-signal spectrum. If an undesirably strong transverse vibration can be detected, the mounting of the piezoactuator is changed, for example by an adjustment, preferably mainly to change those parameters that chiefly affect the tendency to transverse vibrations. The measurement and the change to the mounting are repeated as required until it emerges from the vibrational resonances in the small-signal spectrum that no transverse vibration occurs, or that transverse vibrations or flexural vibrations occurring are below a prescribed limit, particularly below a prescribed maximum amplitude.

A sufficient reduction in the transverse vibrations can be established, in particular, by checking whether vibrational resonances in the small-signal spectrum possibly occur at a prescribed minimum frequency spacing. Instead of, or in addition to, this, it can be checked whether substantial vibrational resonances in the small-signal spectrum occur only above a prescribed minimum frequency, which is determined in advance so that substantially no transverse vibrations occur above this minimum frequency.

Mounting parameters that can be relevant for the occurrence of transverse vibrations are, for example, the position of the piezoactuator in the holders, in particular the angle between the longitudinal direction of the piezoactuator and the alignment of the holders, and the strength and direction of the mechanical stress exerted by the holders on the piezoactuator.

This method for monitoring flexural vibrations of a piezoactuator is based on the fact that the piezoactuator can be used as sensor, because such a piezoelectric component can be used to convert electrical signals into mechanical movements, and mechanical movements into electrical signals. It is possible, in particular, for the absolute value of the impedance of the piezoactuator to be determined as small-signal spectrum as a function of the frequency. The impedance spectrum of a piezoactuator typically has a series resonance and a parallel resonance occurring at a somewhat higher frequency in the range of a mechanical natural vibration.

A series resonance is understood to be the resonance of a series circuit of a capacitor and an inductor. When an alternating current flows through this series circuit, voltages that are phase shifted by 90° in opposition to one another occur across the capacitor and across the inductor. In the event of a resonant frequency, impedance of this series circuit drops theoretically to zero and practically to a local minimum—owing to the ohmic resistance always present. A parallel resonance is understood to be the resonance of a parallel circuit of a capacitor and an inductor. In the event of a resonant frequency, the impedance of this parallel circuit becomes theoretically infinitely large and practically assumes a local maximum—owing to the ohmic resistance always present.

When the impedance of a mounted piezoactuator is measured as a function of frequency, it is possible to detect the electromechanical natural vibrations of the entire arrangement of the mounted piezoactuator and the holders. Mechanical vibrations that are electrically coupled as in the case of a piezoactuator can be detected directly in this way. When the arrangement has natural vibrations, what is obtained is an impedance spectrum respectively having a frequency of the series resonance and a frequency of the parallel resonance in the frequency range characteristic of the relevant natural vibration. Consequently, it is possible to determine the vibration behavior of the mounted piezoactuator, in particular the occurrence of a flexural vibration, from a measurement of the small-signal impedance. The measurement and evaluation of the small-signal spectrum can be carried out by using an electronic control loop. By varying the mounting of the piezoactuator with the aid of the resonances occurring in the small-signal spectrum, it is possible, if appropriate, to achieve an optimization such that flexural vibrations scarcely occur and, ideally, are no longer present.

One advantage of this method resides in the fact that it directly detects the vibration behavior of the piezoactuator and—by contrast with a method aimed only at the geometric optimization of the position of the piezoactuator in the holders—also takes account of an asymmetry inside the piezoactuator. Flexural vibrations can therefore be avoided more effectively than previously.

BRIEF DESCRIPTION OF THE DRAWINGS

There follows a more precise description of examples of the method with the aid of the attached figures, in which.

DETAILED DESCRIPTION OF ILLUSTRATIVE EMBODIMENTS

Figure 1:
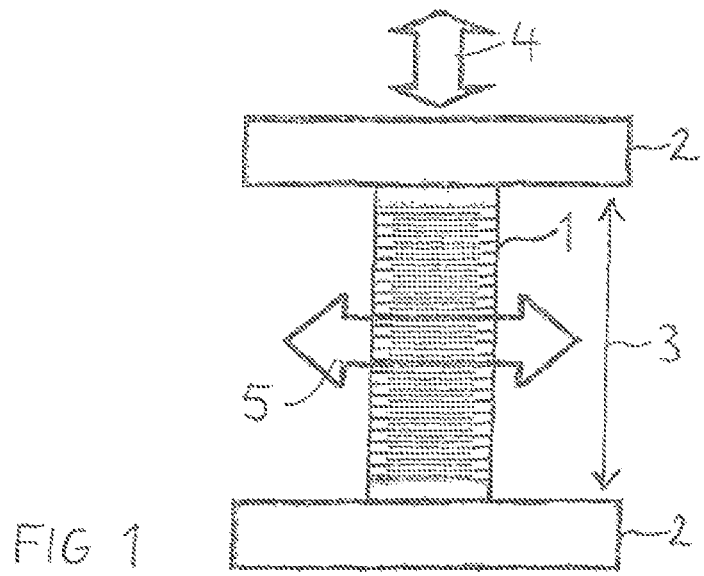
FIG. 1 shows a schematic arrangement of a mounted piezoactuator.

FIG. 1 shows a schematic side view of an arrangement of a mounted piezoactuator 1 between holders 2. The holders 2 can be, for example, parts of an apparatus. The piezoactuator 1 is aligned in a longitudinal direction 3 in which it is possible to excite the longitudinal vibrations 4, which are required for the intended application of the piezoactuator 1. Transverse vibrations 5 can occur transverse to the direction of the longitudinal vibrations and lead to undesired or deleterious deformations of the piezoactuator 1.

Figure 2:
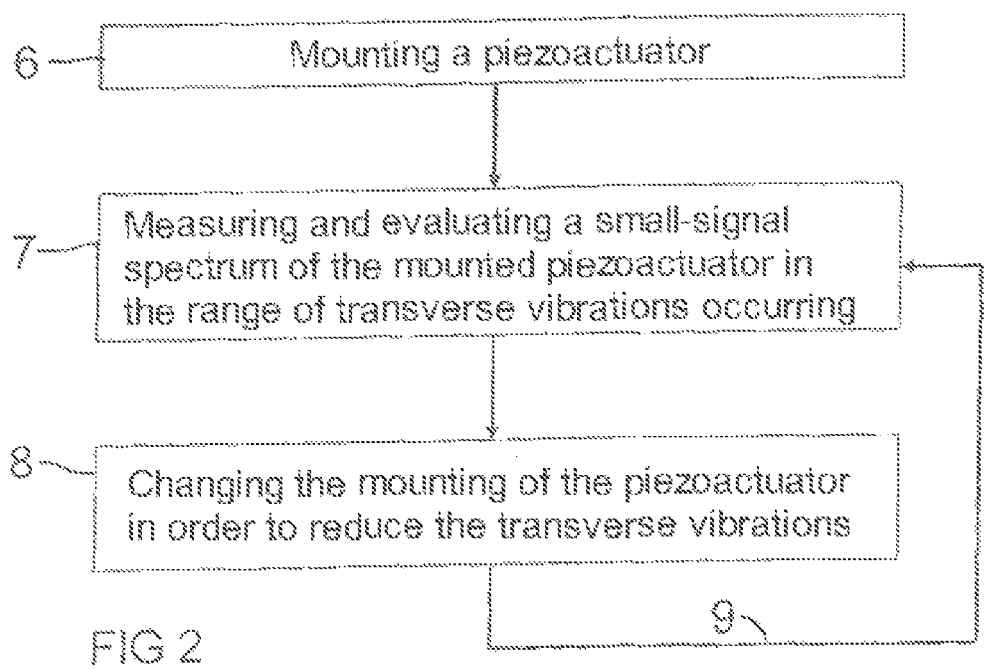
FIG. 2 shows a flowchart relating to an exemplary embodiment of the method that is used to mount a piezoactuator.

In order to eliminate the transverse vibrations as far as possible, the method having the method steps in accordance with the flow chart of FIG. 2 is applied, particularly when mounting the piezoactuator. The piezoactuator is mounted in a first method step 6. In a second method step 7, the measurement and evaluation of a small-signal spectrum of the mounted piezoactuator are conducted in the range of transverse vibrations that may occur. In a third method step 8 following thereupon or carried out at the same time as the second method step 7, the mounting of the piezoactuator is changed in order to reduce the transverse vibrations, in particular mounting parameters are adjusted or corrected until a stipulated impedance spectrum is achieved. An optimization can be undertaken by the repetition 9 of the second method step 7 and the third method step 8 so that, finally, a tolerable minimum of flexural vibrations is achieved or, ideally, the flexural vibrations are eliminated completely.

Figure 3:
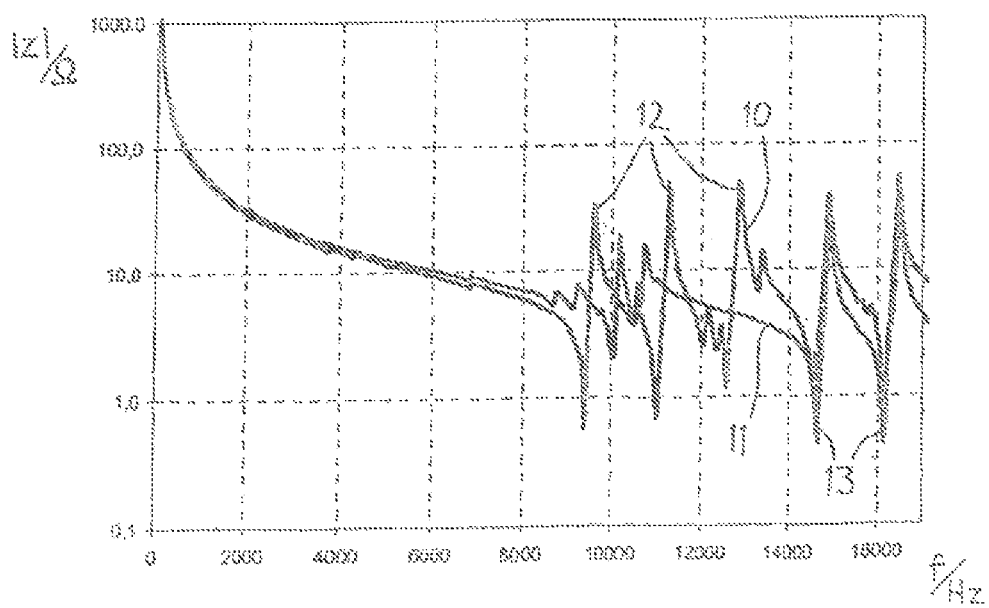
FIG. 3 shows a diagram of an impedance spectrum.

FIG. 3 shows a diagram of an impedance spectrum. Plotted herein against the frequency f in Hz (hertz) is the absolute value |z| of the impedance in Ω (ohm). An impedance curve 10 measured before the optimization shows a plurality of parallel resonances 12 and series resonances 13. In the impedance curve 11 recorded after an optimization of the mounting of the piezoactuator, resonances occur at a greater frequency spacing, and relatively large local maxima and minima of the impedance occur only at high frequencies. It may be gathered therefrom that the occurrence of flexural vibrations was substantially reduced in the course of the optimization.

The described method has the particular advantage that transverse vibrations occurring are detected in a way that permits the direct monitoring of the extent of flexural vibrations during the operation of the piezoactuator, or the direct monitoring of improvements achieved by changing the mounting, and specifically during the measurement, or directly following the measurement, of a small-signal spectrum, in particular of the impedance spectrum, of the mounted piezoactuator. Given deviations from a desired state, it is possible to change relevant mounting parameters until the measurement shows a satisfactory minimization of the flexural vibrations, or the piezoactuator can be entirely replaced as a component. A further advantage is that the method can be carried out by using an electronic control loop and can, for example, be implemented in such a refinement in an electronic maintenance or diagnostic circuit or in an automatic mounting system, thus permitting a rapid, reliable and cost-effective application. A piezoactuator in the case of which the method is applied can, for example, be installed or mounted in an engine intended for a motor vehicle. The method can therefore be used for monitoring purposes in the injector of a motor vehicle with the aim, for example, of early detection of flexural vibrations that are undesired and deleterious for reliable operation.

The invention claimed is:

1. A method for monitoring flexural vibrations of a piezoactuator, the method comprising:
   providing a mounting for the piezoactuator;
   applying an AC voltage exciting longitudinal vibrations in the piezoactuator;
   measuring a small-signal spectrum of the piezoactuator when the longitudinal vibrations are excited;
   monitoring an excitation of a transverse vibration in the piezoactuator from resonances occurring in the small-signal spectrum; and
   changing the mounting of the piezoactuator in the case of an occurrence of an undesirably strong transverse vibration.

2. The method according to claim 1, wherein
   the piezoactuator is mounted between holders in a longitudinal direction in which the longitudinal vibrations are excited;

the measurement of the small-signal spectrum and the change to the mounting are repeated as required until it is detected from resonances in the small-signal spectrum that no transverse vibration, or at most a transverse vibration below a prescribed limit, is excited.

3. The method according to claim 2, wherein the measurement and the change in the mounting are repeated until resonances occur in the small-signal spectrum possibly at a prescribed minimum frequency spacing.

4. The method according to claim 2, wherein the measurement and the change in the mounting are repeated until no resonances occur in the small-signal spectrum.

5. The method according to claim 2, wherein the measurement and the change in the mounting are repeated until any resonances that occur in the small-signal spectrum are above a prescribed minimum frequency.

6. The method according to claim 2, wherein a position and/or an angle of the piezoactuator with reference to the holders is changed in order to change the mounting.

7. The method according to claim 2, wherein a mechanical stress exerted by the holders on the piezoactuator is changed in order to change the mounting.

8. The method according to claim 1, wherein an absolute value of an impedance of the piezoactuator is measured as small-signal spectrum as a function of a frequency of an applied AC voltage.

9. The method according to claim 8, wherein parallel resonances and series resonances of the piezoactuator are determined.

10. The method according to claim 1, wherein the measurement and evaluation of the small-signal spectrum are carried out by using an electronic control loop.

11. The method according to claim 1, wherein the mounting is installed or mounted in an engine provided for a motor vehicle.

* * * * *